United States Patent [19]
Mueller et al.

[11] Patent Number: 6,119,893
[45] Date of Patent: Sep. 19, 2000

[54] COMPONENT ADVANCEMENT AND EXTRACTION METHOD AND APPARATUS

[75] Inventors: Claude Mueller, Vista; Roy Alexander Darling, Encinitas, both of Calif.

[73] Assignee: Ismecam, Vista, Calif.

[21] Appl. No.: 09/074,116

[22] Filed: May 7, 1998

[51] Int. Cl.⁷ .................................................. B65D 37/00
[52] U.S. Cl. ........................ 221/211; 221/278; 414/403; 414/417
[58] Field of Search .................................... 221/197, 211, 221/131, 278, 210, 268, 239; 414/403, 416, 417; 29/743

[56] References Cited

U.S. PATENT DOCUMENTS

| | | | |
|---|---|---|---|
| 3,308,977 | 3/1967 | Cochran et al. | 414/417 |
| 4,953,749 | 9/1990 | Kubota et al. | 221/211 |
| 5,154,316 | 10/1992 | Holcomb et al. | 221/202 |
| 5,165,837 | 11/1992 | Schuppert, Jr. | 414/417 |
| 5,190,431 | 3/1993 | Klug et al. | 414/417 |
| 5,240,139 | 8/1993 | Chirnomas | 221/211 |
| 5,503,299 | 4/1996 | Smith | 221/186 |
| 5,570,812 | 11/1996 | Ando et al. | 221/211 |
| 5,702,224 | 12/1997 | Kubota | 414/403 |

*Primary Examiner*—H. Grant Skaggs
*Attorney, Agent, or Firm*—Merle W. Richman, III

[57] ABSTRACT

An apparatus and method for advancing and extracting a component from a tube or channel of a magazine by the employment of a vacuum to a port that engages an open proximal end of the tube or channel of the magazine where the vacuum is sufficient to advance and hold the component as the head is moved away from the proximal end in a direction parallel to the long axis of the tube or channel of the magazine.

28 Claims, 10 Drawing Sheets

COMPONENT ADVANCEMENT AND EXTRACTION METHOD AND APPARATUS

BACKGROUND OF THE INVENTION

1. Field of the Invention

This invention relates to systems and methods for advancing and removing or extracting components stored in tubes and more particularly to systems and methods for advancing and extracting electrical components commonly stored in tubes or magazines.

2. Description of the Related Art

To efficiently handle small components after manufacture, components are sometimes placed in long narrow tubes that are completely enclosed except at a proximal and distal end where the components may be inserted or removed. The tubes commonly have a stop pin or plug at the proximal and distal end to secure a plurality of components stored therein. Such tubes are most commonly used to hold small electrical components such as integrated circuits. Such tubes only permit components stored therein to move along the long axis of the tube.

Similarly, magazines having one or more rows may also be employed to store or hold a plurality of such components. Similar to tubes, each row of the magazine comprises a channel configured to allow the components to move only along the long axis of the channel. Unlike tubes, the channels are not typically completely enclosed. Each channel of a magazine usually has an open top groove in addition to an open proximal and distal end. A stop pin at the distal and proximal end of each channel may secure components stored in the channels of a magazine.

During different stages of processing, the components stored in a tube or channel of a magazine may be removed for further processing, analysis, packaging or installation in a circuit, for example. Systems and methods have been developed to remove components from such a tube or magazine to enable further processing of the component. The challenge of such systems and methods have been to advance and remove components from such a tube or channel of a magazine in a singular fashion. Three primary approaches have been employed in prior art systems and methods to perform this function: 1) the employment of gravity, i.e., placing the tube or magazine at an angle relative to its long axis to encourage components therein to slide to one of the ends of the tube or magazine (see for example, U.S. Pat. No. 5,503,299 to Smith); 2) the employment of vibration energy to cause the advancement of components to an end of a tube or magazine (see for example, U.S. Pat. No. 5,154,316 to Holcomb et al.); and 3) a combination of 1) and 2), i.e. applying vibrational energy to a tube or magazine held at angle relative to its long axis (see for example, U.S. Pat. No. 5,702,224 to Kubota).

Other variations exist in the prior art including systems and methods that further employ a tapping mechanism to encourage the advancement of components and the transition from an angular plane to a horizontal plane for handling (see for example, U.S. Pat. No. 5,165,837 to Schuppert, Jr. et al.) Prior art systems and methods do not always successfully advance components from a tube or channel of a magazine in a single fashion. Components may twist in the tube or channel jamming components in place depending on the tolerances of the tube or channel relative to the components stored therein. In addition, these systems are complex, expensive to build, and expensive to maintain. Thus, the need thus exists for more reliable, cost-effective systems and methods for advancing and removing components from a tube or channel of a magazine in a singular fashion.

SUMMARY OF THE INVENTION

The present invention includes an apparatus for advancing and extracting a component stored in a tube. The tube has a long axis and a proximal open end and distal open end. The apparatus includes a head capable of engaging the proximal end of the tube. The head includes a vacuum pickup port that is configured to be adjacent to the proximal open end of the tube when the head engages the proximal end of tube. The apparatus may further include a vacuum supply port coupled to the vacuum pickup port. A proximate end of flexible vacuum tube may also be coupled to the vacuum supply port. A distal end of the flexible tube may be coupled to a vacuum generator (source).

It is noted that apparatus may be part of a embossed tape packaging machine. The component may be an electrical component such as an integrated circuit. In other embodiments, components may be stored in a channel of magazine having a plurality of channels. In such an embodiment, the apparatus may further include a channel cover designed to cover a channel along the long axis of the magazine from the proximal end to distal end of the magazine. In either embodiment, the apparatus may further include a head actuator that enables the movement of the head in a direction parallel to the long axis of the tube or magazine to and away from the proximal end of the tube or magazine. The apparatus may further include at least one head connecting rod that connects the head to the head actuator.

The apparatus may also include a single component tray where the tray includes a component nest for holding the component once extracted from the tube or channel of magazine. It is noted that the size of the opening of the vacuum pickup port is ideally smaller than an end area of the component. In addition, ideally the shape of the opening of the vacuum pickup port is similar to the shape of the end area of the component.

The present invention also includes a method of advancing and extracting a component stored in a tube. In one embodiment, the method includes placing a vacuum pickup port of a head adjacent to the proximal open end of the tube. The method further includes applying a vacuum to the vacuum pickup port sufficient to advance the component adjacent to the vacuum pickup port. The method may also include applying a vacuum to a vacuum supply port of the head sufficient to advance the component adjacent to the vacuum pickup port of the head.

In a preferred embodiment, the method may also include moving the head away from the proximal open of the tube in a direction parallel to the long axis of the tube. This embodiment may also include moving the head away from the proximal open of the tube in a direction parallel to the long axis of the tube until the component is within a component nest of a single component tray. Then the method may release the vacuum to the vacuum pickup port.

The invention may also be a method of advancing and extracting a component stored in one of a plurality of channels of a magazine. The magazine has a long axis and each channel has a proximal open end, at least partially open distal end, and at least a partially open top. This method may include placing a vacuum pickup port of a head adjacent to the proximal open end of the one of the plurality of channels of the magazine. This method may further include placing a channel cover over the open top of the one of the plurality of channels. The channel cover extends from the proximal open end to the distal open end of the channel along the long axis of the magazine. The method may also include applying a vacuum to the vacuum pickup port sufficient to advance the component adjacent to the vacuum pickup port.

This method may also include applying a vacuum to a vacuum supply port of the head sufficient to advance the component adjacent to the vacuum pickup port of the head. Similarly, the method may include moving the head away from the proximal open of the one channel of the plurality of channels in a direction parallel to the long axis of the magazine. Ideally, the method moves the head away from the proximal open of the one channel of the plurality of channels in a direction parallel to the long axis of the magazine until the component is within a component nest of a single component tray. Then, the method ideally releases the vacuum to the vacuum pickup port.

DETAILED DESCRIPTION OF THE PREFERRED EMBODIMENTS

Figure 1:
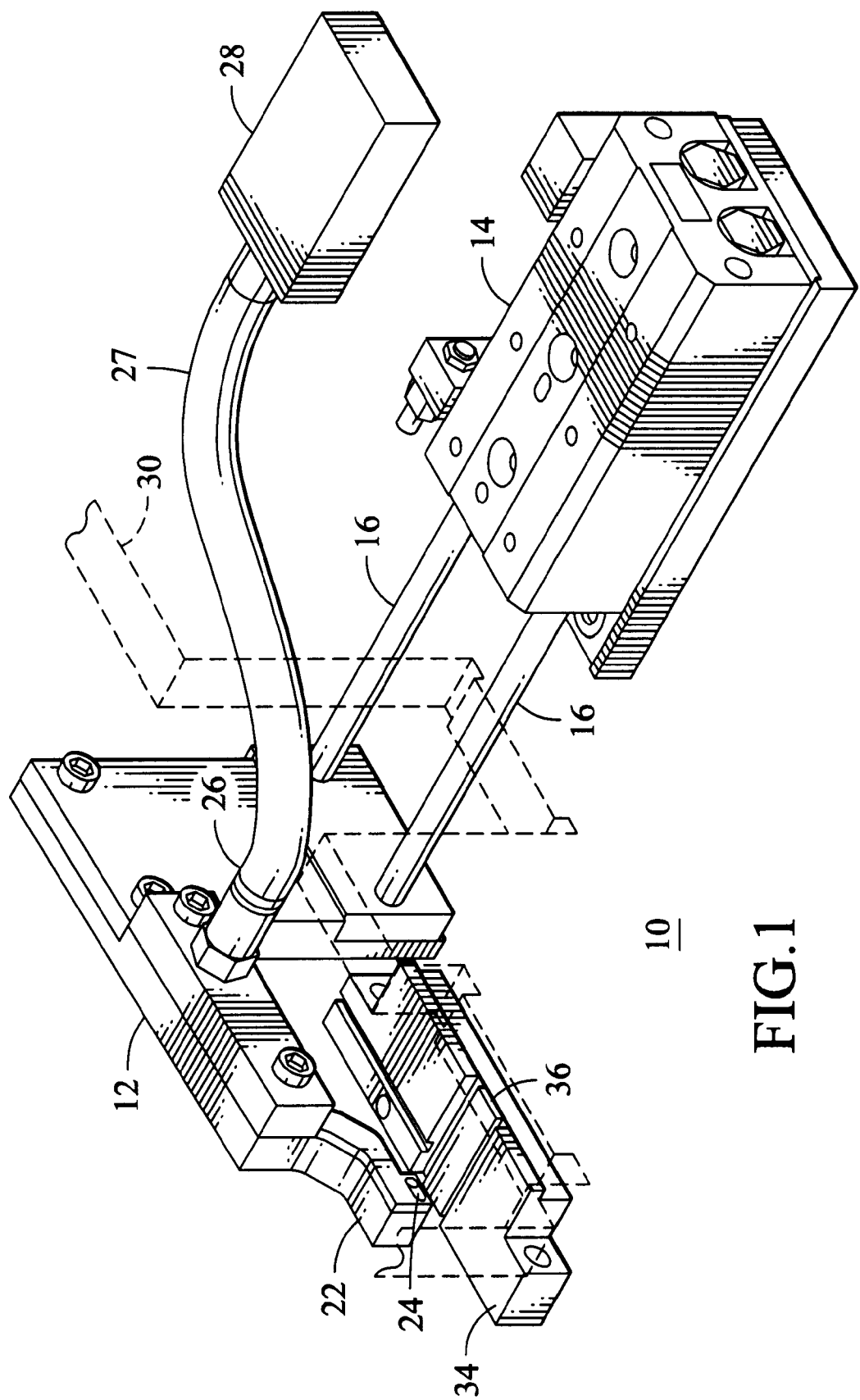
FIG. 1 is a diagram of preferred embodiment of an apparatus according to the present invention.

An exemplary embodiment of apparatus 10 according to the invention is presented with reference to FIG. 1. The component extraction apparatus 10 shown in FIG. 1 includes a head 12, a head actuator 14, head connecting rods 16, flexible vacuum tube 27, vacuum source or generator 28, tube or magazine guide assembly 30, and single component tray 34. Head 12 includes a component pickup 22 that includes a vacuum pickup port 24. Head 12 also includes a vacuum supply port 26. Vacuum supply port 26 is coupled to vacuum pickup port 24 by an air channel (not shown) through head 12.

Vacuum supply port 26 is also coupled to flexible vacuum tube 27. Flexible vacuum tube 27 is also coupled to vacuum source 28 and thereby vacuum supply port 26 and vacuum pickup port 24 are coupled to vacuum source 28. Vacuum source 28 may be any standard, electronically controllable vacuum generator or installed vacuum plumbing. In a preferred embodiment, vacuum source 28 provides a vacuum pressure (−5 to −10 pounds per square inch (psi)). Head actuator 14 is used to move head 12 and thereby vacuum pickup port 24 laterally. Head actuator 14 moves head 12 laterally by withdrawing connecting rods 16 within its housing. Head actuator 14 may employ or generate a negative vacuum to withdraw the rods, i.e., it may be a pneumatically, hydraulically, or electrically controlled.

Figure 2:
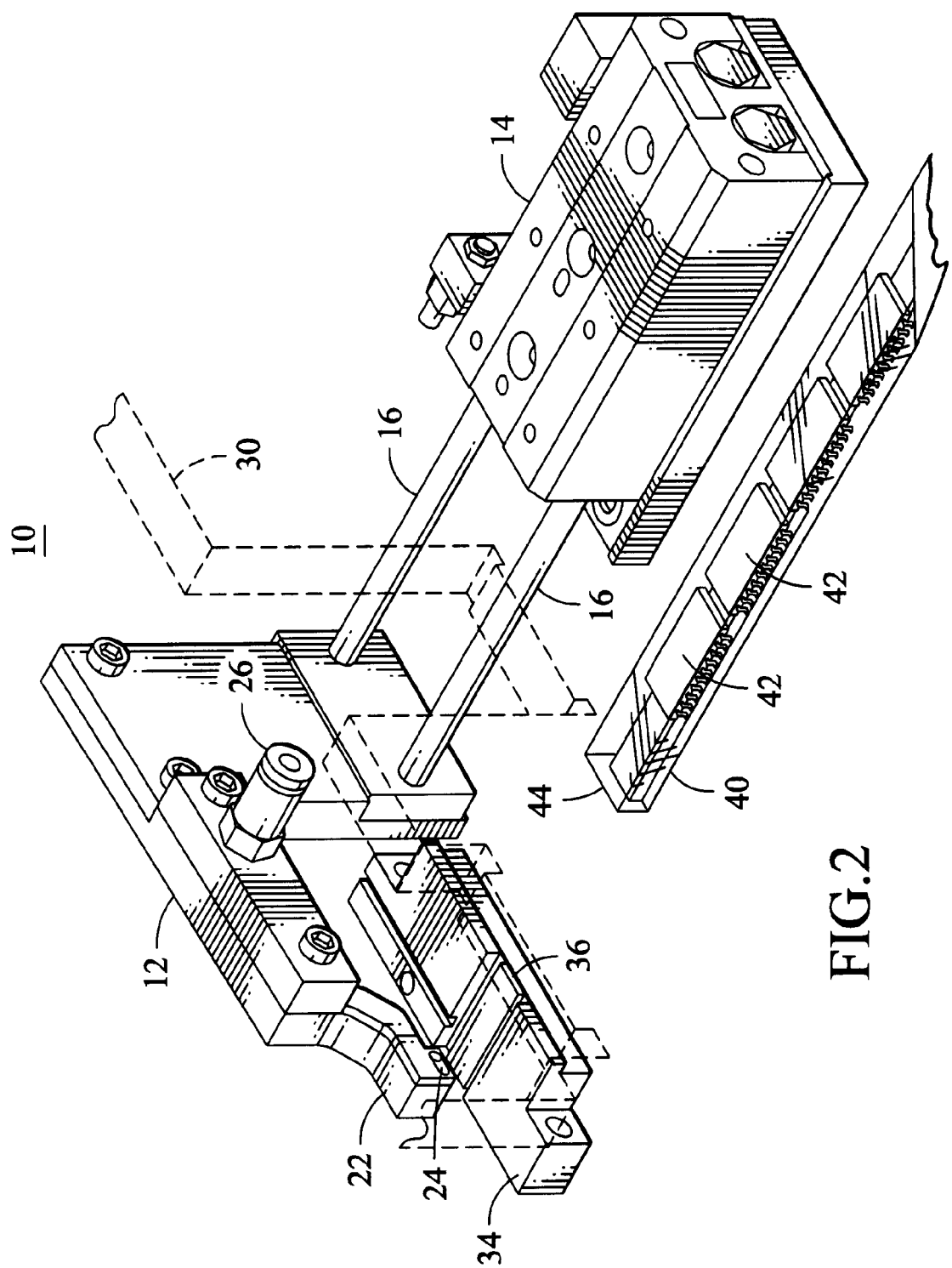
FIG. 2 depicts the apparatus of FIG. 1 with a tube storing a plurality of components.

Tube or magazine guide assembly 30 holds one or more tube or magazines in standby position or alignment. The tubes or magazines are then singalated into position with the vacuum pickup port 24 of head 12. Devices for holding and handling tubes or magazines are well known to those of skill in the art. Single component tray 34 includes a component nest 36 for a holding a component removed from a tube or channel of a magazine as explained with reference to FIGS. 2 to 6. FIGS. 2 to 6 illustrate a method of using extraction apparatus 10 to advance and extract a component from a tube. Referring now to FIG. 2, a tube 40 having an open proximal end 44 and at least partially open distal end (not shown) and storing a plurality of components 44 is positioned in extraction apparatus 10. A plug or peg may be placed at or near the distal end of tube 40. This is the starting point of one method of the present invention. It is noted that size and shape of vacuum pickup port 24 is relative to or approximately the same as the size and shape of the proximal end wall of the components to be advanced and extracted. Ideally, the size or area of the vacuum pickup port 24 is smaller than the size or area of the end wall the components 42 to be extracted. In this embodiment, the vacuum pickup port 24 is substantially rectangular in shape similar to the end wall of components 42.

Figure 3:
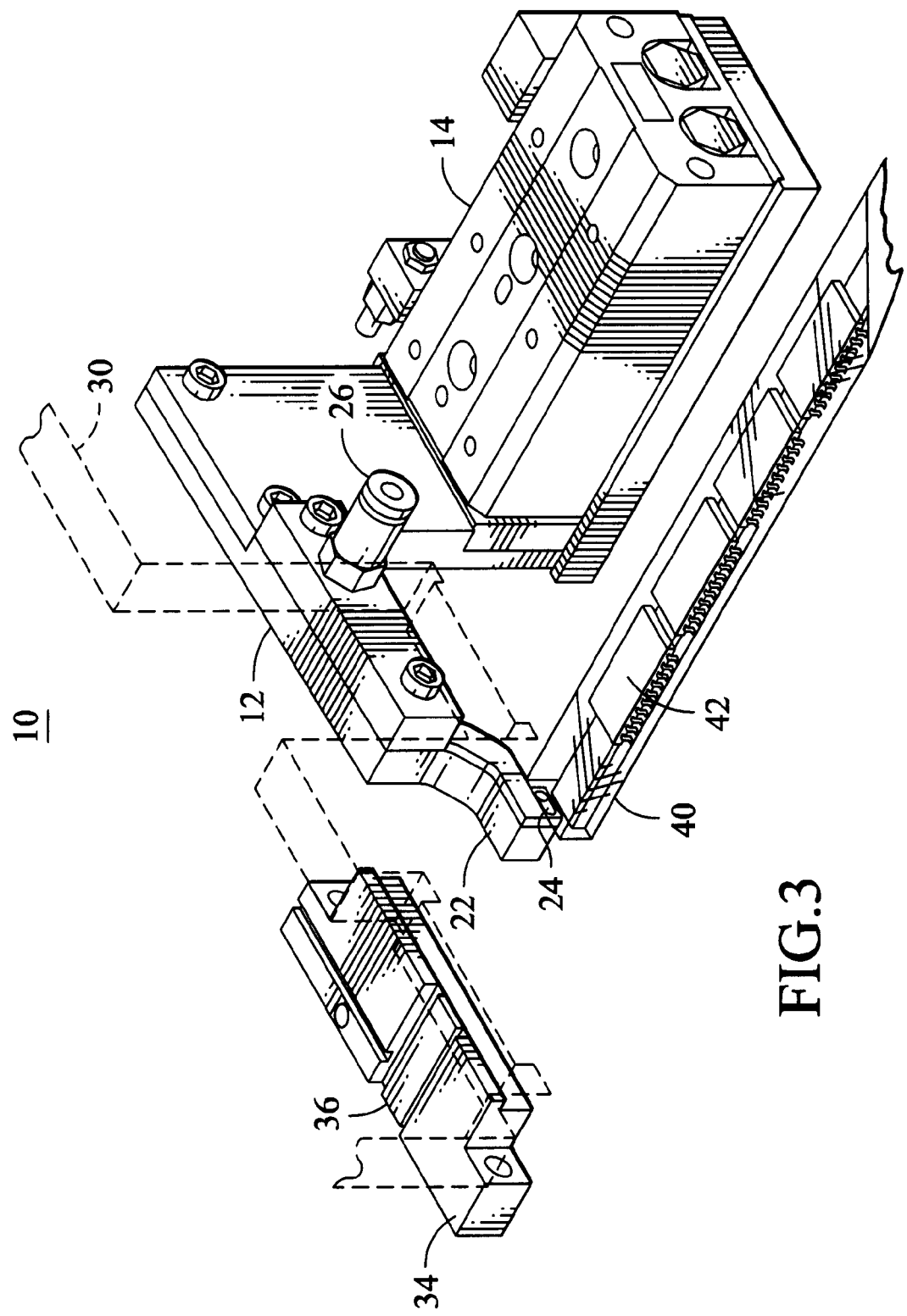
FIG. 3 depicts the apparatus and tube of FIG. 2 where the head of the apparatus has been moved to engage the tube.

The first step of the invention is shown in FIG. 3. In this step, head 12 is moved laterally along the long axis of tube 40 toward the proximal open end 44 of the tube. As discussed above, head actuator 14 moves head 12 laterally by withdrawing rods 16 within its housing. As seen in FIG. 3, vacuum pickup port 24 is adjacent to the proximal open end 44 of tube after the movement of head 12. At this point, vacuum source 28 may be activated to provide a vacuum at vacuum pickup port 24. The result of the generation or application of a vacuum at vacuum pickup port 24 is shown in FIG. 4.

Figure 4:
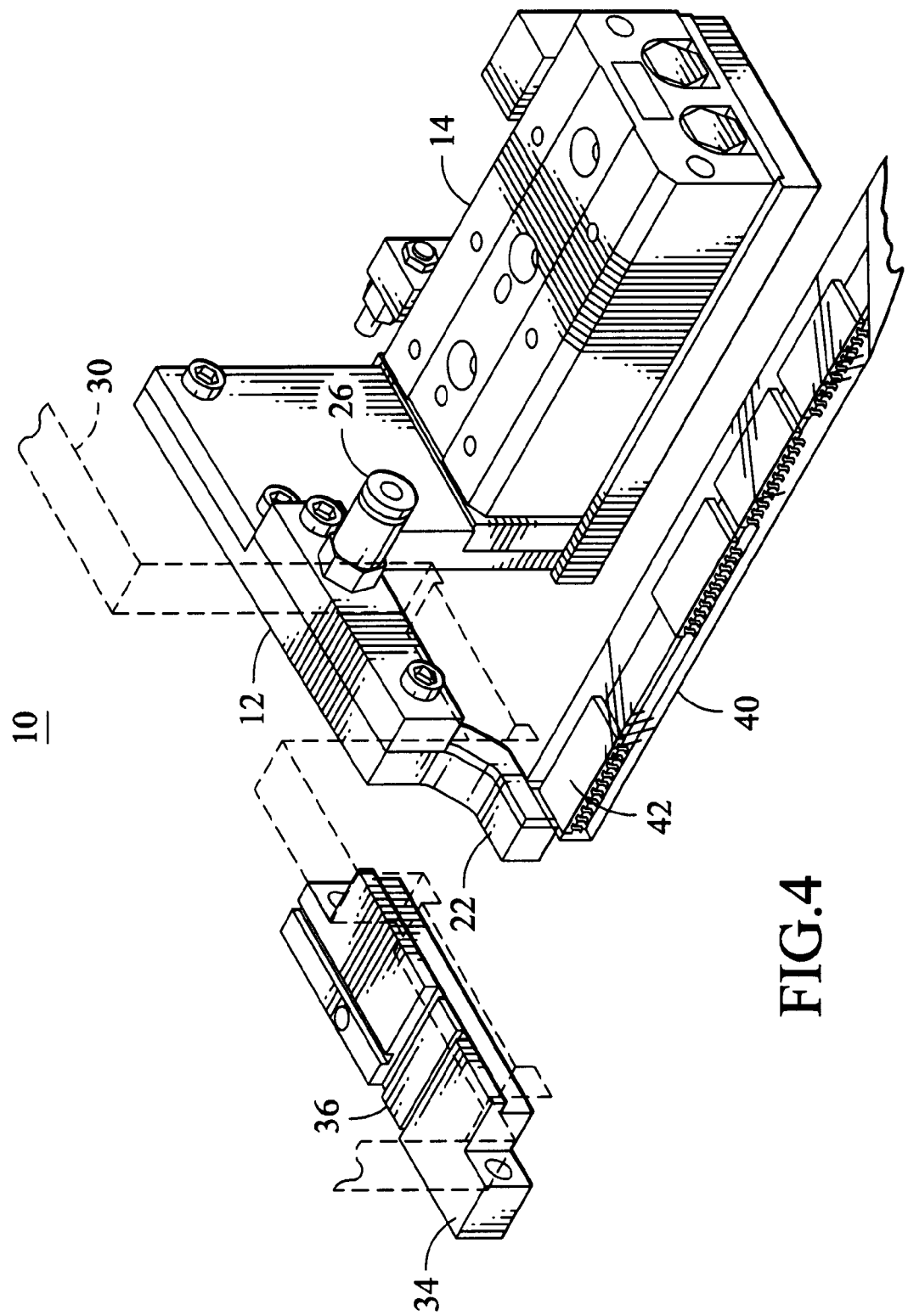
FIG. 4 depicts the apparatus and tube of FIG. 3 where a component in the tube has been advanced to the head of the apparatus.
Figure 5:
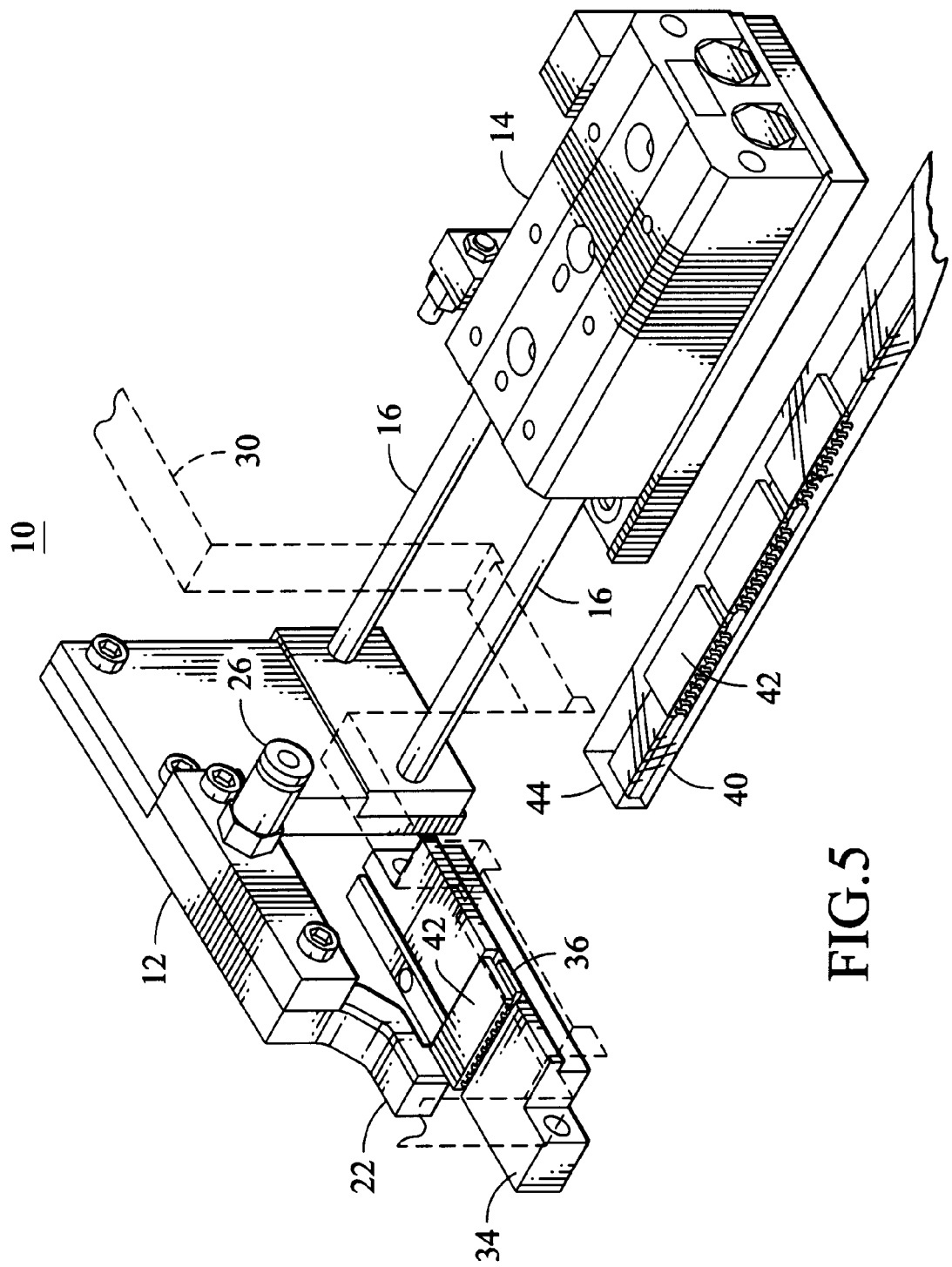
FIG. 5 depicts the apparatus and tube of FIG. 4 where the component advanced to the head has been withdrawn from the tube and placed in a component nest.

As shown in FIG. 4, the application of a vacuum at vacuum pickup port 24 causes the most proximal component 42 to be advanced to a position directly adjacent to the vacuum pickup port 24. Further, the vacuum causes component 42 to become engaged with vacuum pickup port 24. At this point when head 12 is moved laterally away from the proximal end 44 of tube 40, engaged component 42 will remain attached or engaged to vacuum pickup port 24. In the next step of the invention as shown in FIG. 5, head 12 is moved laterally away from tube 40 until the engaged or attached component 42 is positioned within the component nest 36 of single component tray 34.

Figure 6:
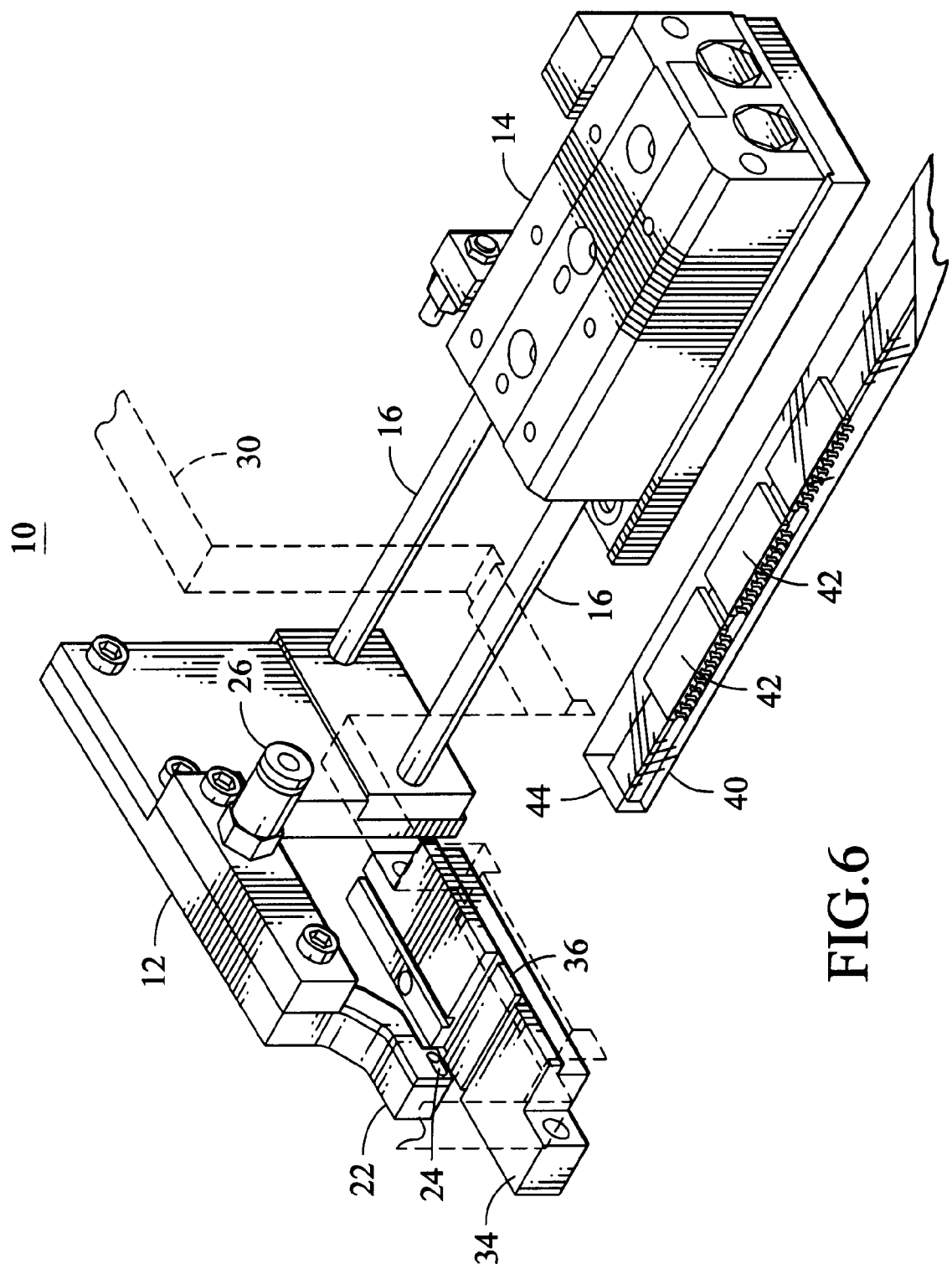
FIG. 6 depicts the apparatus and tube of FIG. 5 where the extracted component has been removed from the component nest so the process depicted by FIGS. 3 to 5 can be cycled again to advance and extract another component stored in the tube.

As noted above, head actuator 14 moves head 12. In this step, head actuator 14 moves head 12 by extending rods 16 outside of its body. In a preferred embodiment of the invention, head actuator 14 only has two positions, rods 16 fully extended or fully withdrawn. In another embodiment, head actuator 14 may have a regulated axis for variable component or tube location. When the rods are fully extended, head 12 is ideally positioned as shown in FIG. 5. When rods 16 are fully withdrawn, head 12 is ideally positioned as shown in FIG. 4. At the point shown in the method shown in FIG. 5, vacuum generator 28 may be directed to vent or release the negative pressure stored with the flexible vacuum tube and air channel of head 12 thereby releasing the component to rest in the component nest. A separate mechanism (not shown) may then pickup component 42 resting in component nest 36 for further processing as discussed briefly below. The results of such an operation is shown in FIG. 6. Now the process may be repeated by withdrawing rods 16 to engage vacuum pickup port 24 with proximal open end 44 of tube 40 as shown in FIG. 3, thus starting another cycle of the method of the present invention.

Figure 7A:
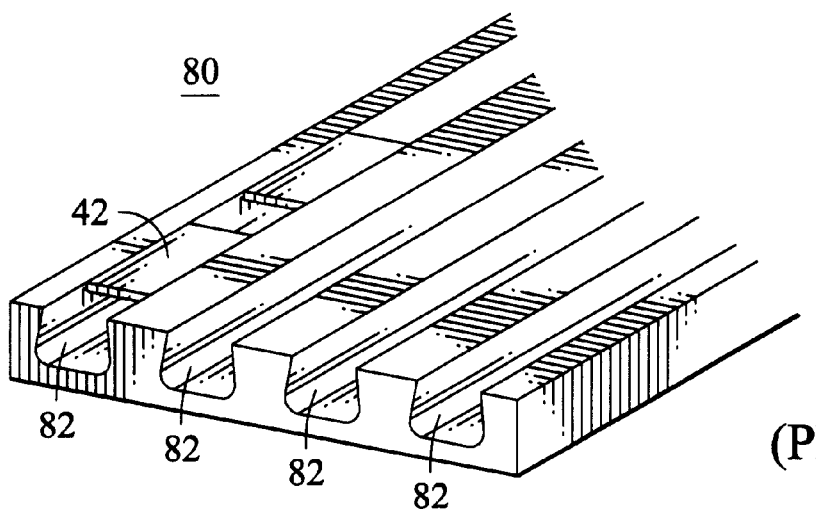
FIG. 7a (Prior Art) depicts a magazine having four channels and a plurality of components in one of the four channels.
Figure 7B:
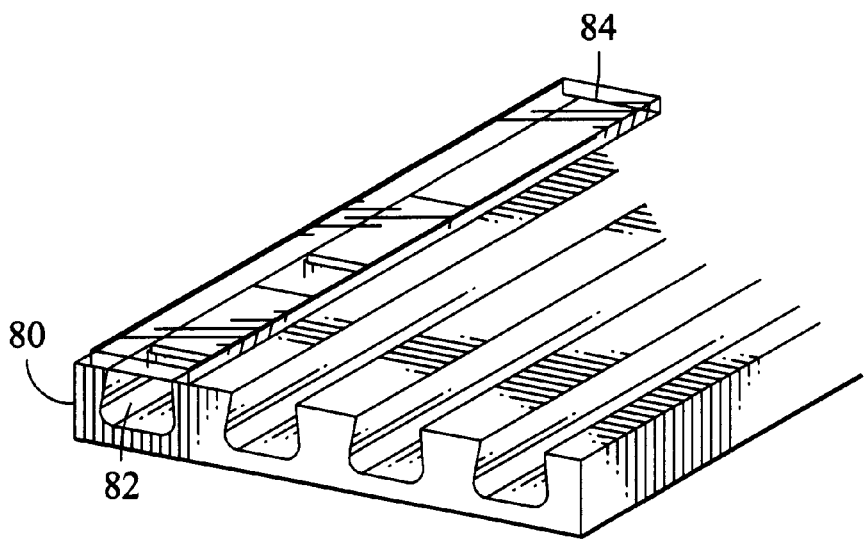
FIG. 7b depicts the magazine of FIG. 7b with a channel cover according to the present invention.

As noted above, extraction apparatus 10 may also be used to advance and extract components that are stored in channels of a magazine. An exemplary magazine 80 having four channels 82 with components 42 in at least one of the channels is shown in FIG. 7a. As shown in this Figure, each channel has an open top. In order to generate a negative pressure within a channel to advance and extract a component according to the present invention, a channel cover 84 as shown in FIG. 7b is employed. As shown in FIG. 7b, channel cover 84 completely covers the top opening of a channel from the proximal open end of the channel to the distal open end of the channel. This enables extraction apparatus 10 of the present invention to generate sufficient negative pressure (or vacuum) within channel 82 having channel cover 84 to advance and engage a component stored therein.

It is noted that channel cover 84 may cover a plurality of channels 82. In addition, extraction apparatus 10 may be modified to have more than vacuum pickup head 24. In addition, additional component nests 36 may be added to single component tray 34 in such an embodiment. Such an embodiment may enable the parallel advancement and extraction of multiple components 42 from a plurality of channels 82 of a magazine. Such a system may also be employed where multiple tubes are placed side by side, on top of each other, or a combination of both. Other variations within the scope of the present invention may be imaged. In addition, different configurations of an extraction apparatus that employs a vacuum to advance and extract a component 42 from a tube 40 or magazine 82 are within the scope of the present invention. It is noted that a blower may also be employed to provide positive air pressure at the distal end of tube 40 or magazine 82. This may aid advancement of components, in particular when only one or more components are in the tube or a channel of a magazine. An example of another embodiment is presented with reference to FIG. 8.

Figure 8:
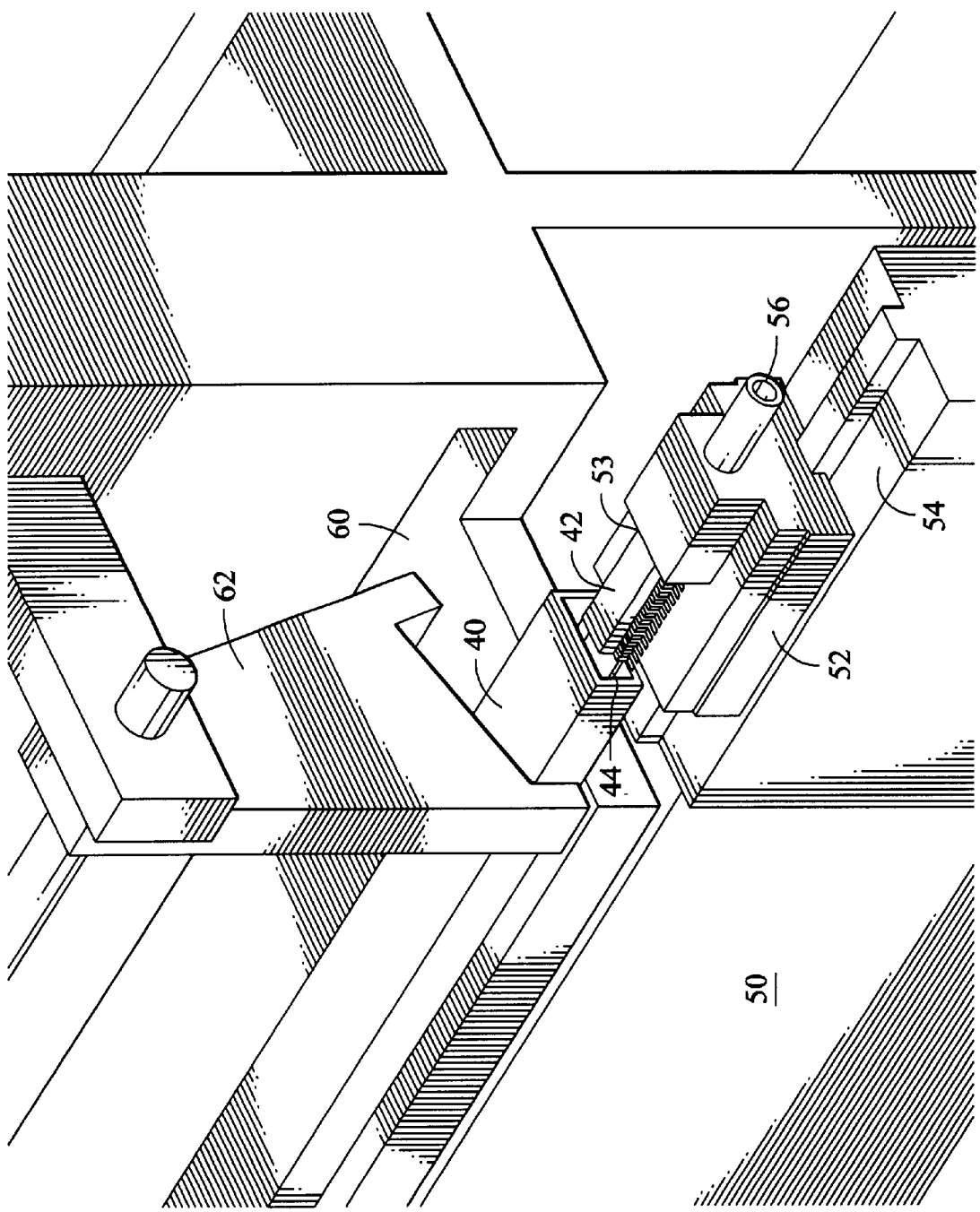
FIG. 8 is a partial diagram of another embodiment of an apparatus according to the present invention.

The extraction apparatus 50 shown in FIG. 8 includes a slidable head 52 having a vacuum port 53 and vacuum tube attachment or supply port 56, mount or slide assembly 54 for head 52, tube mount 60 and tube feeder 62. In this embodiment, similar to extraction apparatus 10, head 52 includes a vacuum pickup port 53 to engage open proximal end 44 of tube 40 to advance and extract components 42. In this embodiment, head 52 slides on a slide assembly 54 to engage the vacuum pickup port 53 with end 44. Vacuum supply port 56 is coupled to vacuum pickup port 53 by an air channel (not shown). A method similar to the method used for extraction apparatus 10 may be employed to advance and extract components stored in tube 40. Instead of head actuator 14, a different actuator (not shown) may be employed to move head 52 so that pickup port 54 may engage and move laterally to and away from end 44 of tube 40. Tube feeder 62 may be used to discard a tube 40 after all components stored therein have been removed.

Figure 9:
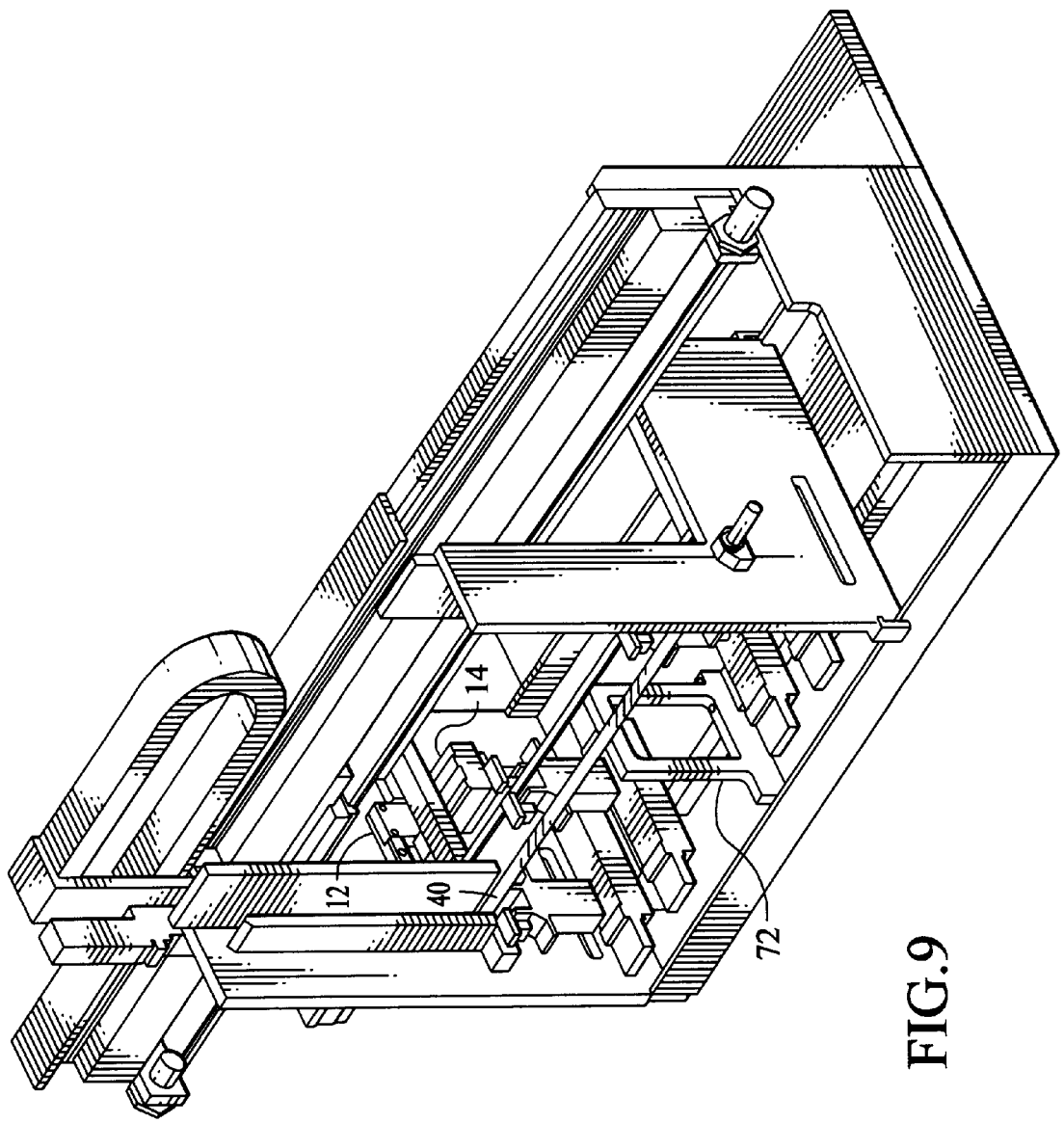
FIG. 9 is a diagram of tube stacker including the apparatus shown in FIG. 1.

Extraction apparatus 10 and 50 may be employed on any machine in which components stored in tubes or magazines are processed. An example of a tube or magazine component extractor apparatus employing extraction apparatus 10 of the present invention is shown in FIG. 9. Apparatus 70 includes a tube handler 72 and extraction apparatus 10 (segments including head 12 and head actuator 14 are shown in FIG. 9.) Apparatus 70 may be part of a larger mechanism or apparatus that processes components stored in tubes. Such an apparatus is shown in FIG. 10.

Figure 10:
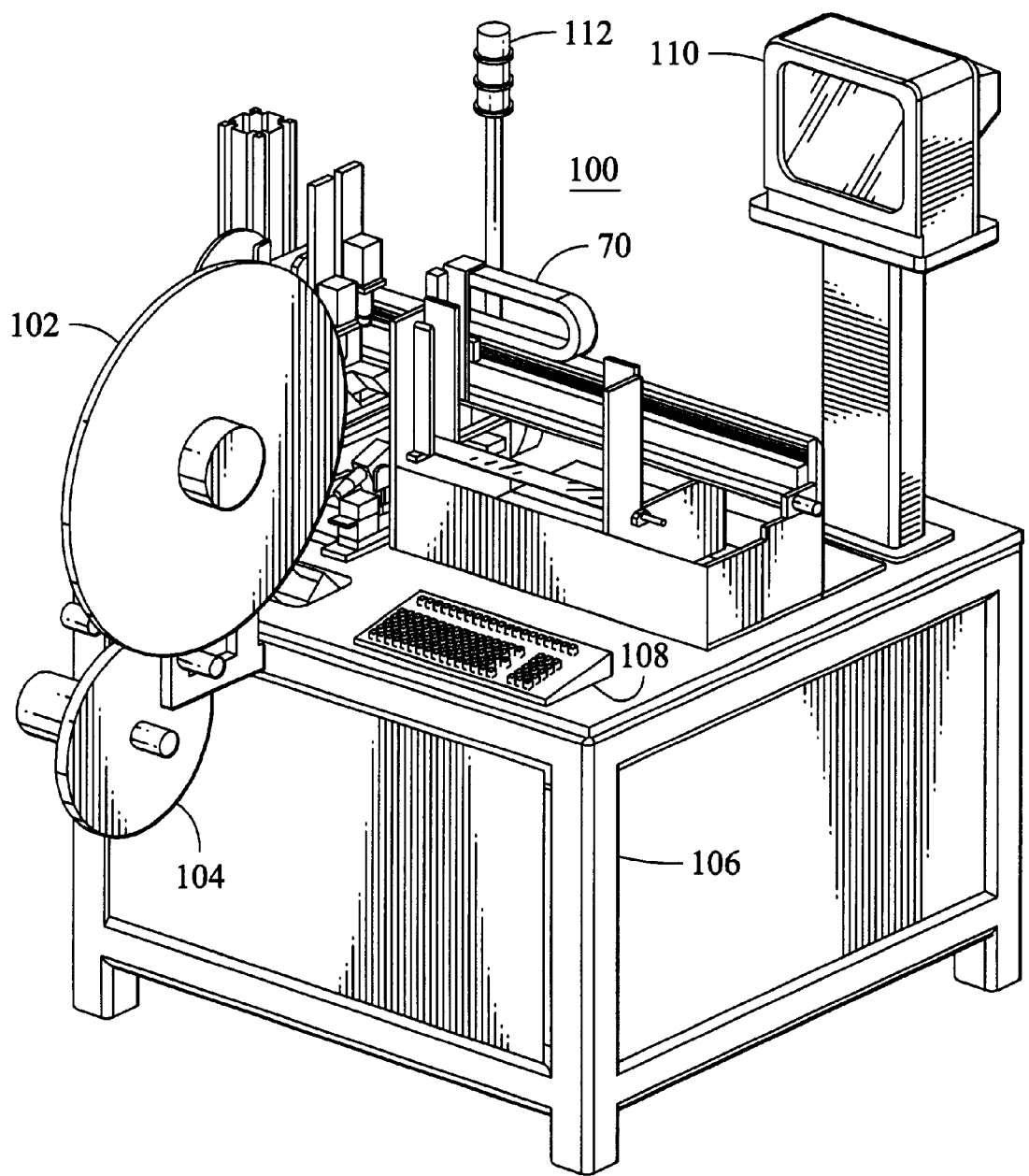
FIG. 10 is a diagram of an embossed tape packaging machine for components including the tube stacker shown in FIG. 9.

FIG. 10 depicts an embossing tape packaging machine 100. Machine 100 extracts components 42 stored in tubes 40, inspects the components 42 and places the inspected components 42 in embossed tape.

Embossing tape packaging machine 100 includes tube and component extractor apparatus 70, embossed tape feeder 102, embossed tape return 104, machine base 106, keyboard 108, console or display 10, and warning light 112. Apparatus 70 was described above and the remaining elements of machine 100 are known to those of skill in the art. As noted, exemplary extractor 10 and 50 may be employed in any device or machine that handles or process components stored in tubes or magazines.

What is claimed is:

1. A method of advancing and extracting a component stored in a tube, the tube having a long substantially horizontal axis and a proximal open end and an at least partially open distal end, the method comprising the steps of:
    a) placing a vacuum pickup port of a head adjacent to the proximal open end of the tube; and
    b) applying a vacuum to the vacuum pickup port sufficient to advance the component from the distal end of the tube to the proximal end of the tube so the component is adjacent to the vacuum pickup port.

2. The method of claim 1, wherein step b) includes applying a vacuum to a vacuum supply port of the head sufficient to advance the component adjacent to the vacuum pickup port of the head.

3. The method of claim 2, further comprising the step of moving the head away from the proximal open end of the tube in a direction parallel to the long axis of the tube.

4. The method of claim 2, further comprising the steps of:
    a) moving the head away from the proximal open end of the tube in a direction parallel to the long axis of the tube until the component is within a component nest of a single component tray; and
    b) releasing the vacuum to the vacuum pickup port.

5. The method of claim 2, wherein the head is part of an embossing tape packaging machine.

6. The method of claim 5, wherein the component is one of an electrical or an electronic component.

7. A method of advancing and extracting a component stored in one of a plurality of channels of a magazine, the magazine having a long substantially horizontal axis and each channel having a proximal open end, an at least partially open distal end, and an at least partially open top, the method comprising the steps of:
    a) placing a vacuum pickup port of a head adjacent to the proximal open end of the one of the plurality of channels of the magazine;
    b) placing a channel cover over the open top of the one of the plurality of channels, the channel cover extending from the proximal end to the distal end of the channel along the long axis of the magazine; and
    c) applying a vacuum to the vacuum pickup port sufficient to advance the component from the distal end of the channel to the proximal end of the channel so the component is adjacent to the vacuum pickup port.

8. The method of claim 7, wherein step c) includes applying a vacuum to a vacuum supply port of the head sufficient to advance the component adjacent to the vacuum pickup port of the head.

9. The method of claim 8, further comprising the step of moving the head away from the proximal open end of the one channel of the plurality of channels in a direction parallel to the long axis of the magazine.

10. The method of claim 8, further comprising the steps of:
   a) moving the head away from the proximal open end of the one channel of the plurality of channels in a direction parallel to the long axis of the magazine until the component is within a component nest of a single component tray; and
   b) releasing the vacuum to the vacuum pickup port.

11. A method of advancing and extracting a component stored in a tube, the tube having a long axis and a proximal open end and an at least partially open distal end, the method comprising the steps of:
   a) placing a vacuum pickup port of a head adjacent to the proximal open end of the tube;
   b) applying a vacuum to a vacuum supply port of the head sufficient to advance the component adjacent to the vacuum pickup port of the head;
   c) moving the head away from the proximal open end of the tube in a direction parallel to the long axis of the tube until the component is within a component nest of a single component tray; and
   d) releasing the vacuum to the vacuum supply port.

12. The method of claim 11, wherein the component is one of an electrical or an electronic component.

13. A method of advancing and extracting a component stored in one of a plurality of channels of a magazine, the magazine having a long axis and each channel having a proximal open end, an at least partially open distal end, and an at least partially open top, the method comprising the steps of:
   a) placing a vacuum pickup port of a head adjacent to the proximal open end of the one of the plurality of channels of the magazine;
   b) placing a channel cover over the open top of the one of the plurality of channels, the channel cover extending from the proximal end to the distal end of the channel along the long axis of the magazine;
   c) applying a vacuum to a vacuum supply port of the head sufficient to advance the component adjacent to the vacuum pickup port of the head;
   d) moving the head away from the proximal open end of the one channel of the plurality of channels in a direction parallel to the long axis of the magazine until the component is within a component nest of a single component tray; and
   e) releasing the vacuum to the vacuum supply port.

14. The method of claim 13, wherein the component is one of an electrical or an electronic component.

15. An apparatus for advancing and extracting a component stored in a tube, the tube having a long axis and a proximal open end and an at least partially open distal end, the apparatus comprising:
   a) a head having a vacuum pickup port coupled to a vacuum supply port;
   b) means for placing the vacuum pickup port of the head adjacent to the proximal open end of the tube;
   c) means for applying a vacuum to the vacuum supply port of the head sufficient to advance the component adjacent to the vacuum pickup port of the head;
   d) a single component tray having a component nest;
   e) means for moving the head away from the proximal open end of the tube in a direction parallel to the long axis of the tube until the component is within the component nest of the single component tray; and
   f) means for releasing the vacuum to the vacuum supply port.

16. The apparatus of claim 15, wherein the component is one of an electrical or an electronic component.

17. An apparatus for advancing and extracting a component stored in one of a plurality of channels of a magazine, the magazine having a long axis and each channel having a proximal open end, an at least partially open distal end, and an at least partially open top, the apparatus comprising:
   a) a head having a vacuum pickup port coupled to a vacuum supply port;
   b) means for placing the vacuum pickup port of the head adjacent to the proximal open end of the one of the plurality of channels of the magazine;
   c) means for placing a channel cover over the open top of the one of the plurality of channels, the channel cover extending from the proximal end to the distal end of the channel along the long axis of the magazine;
   d) means for applying a vacuum to the vacuum supply port of the head sufficient to advance the component adjacent to the vacuum pickup port of the head;
   e) a single component tray having a component nest;
   f) means for moving the head away from the proximal open end of the one channel of the plurality of channels in a direction parallel to the long axis of the magazine until the component is within the component nest of the single component tray; and
   g) means for releasing the vacuum to the vacuum supply port.

18. The apparatus of claim 17, wherein the component is one of an electrical or an electronic component.

19. An apparatus for advancing and extracting a component stored in a tube, the tube having a long substantially horizontal axis and a proximal open end and an at least partially open distal end, the apparatus comprising:
   a) a head having a vacuum pickup port coupled to a vacuum supply port;
   b) means for placing the vacuum pickup port of the head adjacent to the proximal open end of the tube; and
   c) means for applying a vacuum to the vacuum pickup port sufficient to advance the component adjacent to the vacuum pickup port.

20. The apparatus of claim 19, wherein the means for applying a vacuum comprises means for applying a vacuum to the vacuum supply port of the head sufficient to advance the component adjacent to the vacuum pickup port of the head.

21. The apparatus of claim 20, further comprising means for moving the head away from the proximal open end of the tube in a direction parallel to the long axis of the tube.

22. The apparatus of claim 20, further comprising:
   d) a single component tray having a component nest;
   e) means for moving the head away from the proximal open end of the tube in a direction parallel to the long axis of the tube until the component is within the component nest of the single component tray; and
   f) means for releasing the vacuum to the vacuum pickup port.

23. The apparatus of claim 22, wherein the component is one of an electrical or an electronic component.

24. The apparatus of claim 20, wherein the head is part of an embossing tape packaging machine.

25. An apparatus for advancing and extracting a component stored in one of a plurality of channels of a magazine, the magazine having a long substantially horizontal axis and each channel having a proximal open end, an at least partially open distal end, and an at least partially open top, the apparatus comprising:
   a) a head having a vacuum pickup port coupled to a vacuum supply port;
   b) means for placing the vacuum pickup port of the head adjacent to the proximal open end of the one of the plurality of channels of the magazine;
   c) means for placing a channel cover over the open top of the one of the plurality of channels, the channel cover extending from the proximal end to the distal end of the channel along the long axis of the magazine; and
   d) means for applying a vacuum to the vacuum pickup port sufficient to advance the component adjacent to the vacuum pickup port.

26. The apparatus of claim 25, wherein the means for applying a vacuum comprises means for applying a vacuum to the vacuum supply port of the head sufficient to advance the component adjacent to the vacuum pickup port of the head.

27. The apparatus of claim 26, further comprising means for moving the head away from the proximal open end of the one channel of the plurality of channels in a direction parallel to the long axis of the magazine.

28. The apparatus of claim 26, further comprising:
   e) a single component tray having a component nest;
   f) means for moving the head away from the proximal open end of the one channel of the plurality of channels in a direction parallel to the long axis of the magazine until the component is within a component nest of a single component tray; and
   g) means for releasing the vacuum to the vacuum pickup port.

* * * * *